US005268538A

United States Patent [19]

Queen

[11] Patent Number: 5,268,538

[45] Date of Patent: Dec. 7, 1993

[54] HEMISPHERICALLY WIDE-RADIATING-ANGLE LOUDSPEAKER SYSTEM

[75] Inventor: Daniel Queen, New York, N.Y.

[73] Assignee: Sonic Systems, Inc., Stamford, Conn.

[21] Appl. No.: 713,882

[22] Filed: Jun. 12, 1991

[51] Int. Cl.$^5$ .............................................. H05K 5/00

[52] U.S. Cl. .................................. 181/144; 181/152; 181/153; 181/155; 181/199

[58] Field of Search ............... 181/144, 145, 152, 153, 181/154, 155, 191, 199; 381/158, 160

[56] References Cited

U.S. PATENT DOCUMENTS 3,590,942 7/1971 Globa .
3,819,005 6/1974 Westlund .
3,819,006 6/1974 Westlund .
4,134,471 1/1979 Queen .
4,281,738 8/1981 Jackson .
4,322,578 3/1982 Selmin .
4,344,504 8/1982 Howze .
4,348,549 9/1982 Berlant .
4,474,258 10/1984 Westlund .
4,588,042 5/1986 Palet et al. .
4,730,693 3/1988 Kobus .
4,836,328 6/1989 Ferralli .
4,850,452 7/1989 Wolcott .
4,965,837 10/1990 Murayama et al. .
4,967,872 11/1990 Hart .
5,086,871 2/1992 Barbe ............................. 181/155 X

*Primary Examiner*—Michael L. Gellner
*Assistant Examiner*—Khanh Dang

[57] ABSTRACT

A loudspeaker system having the ability to uniformly direct high-frequency as well as low-frequency sound hemispherically is described. The acoustical centers of a low-frequency and a high-frequency driver are aligned in space to provide a common source of sound to be directed through a common sound-guiding structure. The high-frequency sound is guided by the formation of an acoustical horn between the spherical mounting structure of the low-frequency driver and the reflector generally employed in reflecting and diffracting low-frequency sounds. One side of the acoustical horn has an acoustic path length smaller than the other, forcing sound to further diffract upon passage from the horn.

16 Claims, 3 Drawing Sheets

HEMISPHERICALLY WIDE-RADIATING-ANGLE LOUDSPEAKER SYSTEM

BACKGROUND OF THE INVENTION

1. Field of the Invention

This invention relates in general to a loudspeaker system comprising drivers of different frequency characteristics which are used in conjunction with the structure of the system for hemispherical radiation of sound for the different frequencies.

2. Description of the Prior Art

It is desirable to reduce amplitude-frequency-response distortion associated with the directional nature of typical piston type drivers forming loudspeaker assemblies. The frequency distortion associated with a piston type drive such as a cone loudspeaker, varies as a function of the radiating angle from the center axis passing through the center of the driver. Such distortion results from the relationship of the wavelength of the sound to be reproduced to the effective diameter of the piston creating the pressure waves of sound in air as that diameter is modified by the dispersion of sound through the diaphragm of the driver and the resonant modes of the diaphragm.

Conceptually, the amplitude of certain frequencies from a single loudspeaker will vary upwards and downwards as the angle from the axis of the driver is varied. The position of the low-amplitude values, called nulls, where sound of a particular frequency may be so low as to be inaudible, are often arranged nearly symmetrically around the axis of the loudspeaker, in an pattern undulating with the high-amplitude values, called lobes.

More specifically, as discussed in U.S. Pat. No 4,134,471 to Queen, the sound pressure radiated at a given frequency by a simple piston has a distribution pattern in space around the driver described by a type-1 Bessel function. This type-1 Bessel function distribution pattern has periodic lobes and nulls in the sound distribution pattern reminiscent of a (sin x)/x distribution of amplitude as a function of the angle from the axis of the driver. Because the lobes cannot coincide in space for every frequency, a listener at a single position will hear amplitudes ranging from lobes at some frequencies to nulls at others. From position to position, a listener will hear a different amplitude-frequency response.

Prior art loudspeaker systems attempted to reduce this null to lobe variation and achieve a large degree of wide angle sound directivity by the placing of many high- and low-frequency drivers on various surfaces of the enclosure of the loudspeaker system. If multiple drivers are employed, the overlap in their respective patterns is claimed to generate an overall pattern having fewer undesirable lobes. An example of such a system wherein multiple drivers are placed on the walls of the loudspeaker enclosure is shown in U.S. Pat. No. 3,590,942 issued to Globa. The shortcoming of such a configuration is the requirement for relatively large number of drivers within the enclosure and the probability that phase interference among the multiple drivers will create yet more nulls and lobes.

Another approach to creating wide-angle radiation of sound is to use sound reflectors in conjunction with a few direct-radiator type drivers to enhance the drivers' sound distribution capability, as shown, for example, in U.S. Pat. No. 3,819,005 to Westlund. Here, two drivers are mounted on a spherical shell juxtaposed to reflectors to increase the scattering of the sound from the drivers. This system is limited to the use of direct-radiator single-cone drivers or, in the alternative, coaxially-mounted low- and high-frequency drivers, combined in the space of each of the single-cone drivers. Typically, a single-cone direct-radiator driver has limited high-frequency response due to its size and mass. Because of this limitation, full-audio-spectrum-range radiation over a wide angle is not achieved. Alternatively, where a high-frequency driver is mounted coaxially, in the space of the single-cone low-frequency driver, to radiate into the reflector in conjunction with the low-frequency driver, the high-frequencies would scatter. However, this scatter is as a function of the increasing size of the structure, in a manner that creates cancellations of sound between the sphere and the reflector, thus reducing, particularly in larger structures, the ability of the nigh-frequency driver thus mounted to increase the bandwidth of the radiation.

A similar concept characterized by the use of a reflector in conjunction with multiple direct-radiator drivers is shown in U.S. Pat. No. 3,819,006 to Westlund. Here, a common reflector to three drivers housed in spherical enclosures is shown. Again, only a single-cone type of driver matched to the reflector is disclosed, thereby constraining the frequency response of the system to the limited frequency Performance ability of the single-cone driver arrangement.

Yet another mechanism for distributing sound while minimizing the presence of lobes as described above is the use of multiple horns. However, because of the physical dimensions of each of the multiple horns, the separate drivers have to be separated from each other, resulting in phase cancellations among the signals generated by the multiple horns. These phase cancellations at various frequencies will create inconsistent and non-uniform lobes acoustically similar to the ones discussed in conjunction with the (sin x)/x distribution from the axis of a driver. As described before, such lobes are undesirable as they severely distort the amplitude-frequency response of an audio signal at various points in space.

It is therefore an objective of the present invention to provide a loudspeaker system having two types of drivers, one of the low-frequency type and one of a high-frequency type, working concurrently with a single horn-like, sound-guiding structure having reflector characteristics for low frequencies and horn characteristics for high frequencies, thereby achieving generally hemispherical distribution of the sound waves radiated by both types of drivers.

Another objective of the present invention is to provide a loudspeaker system having drivers of multiple types working in conjunction with a single horn-like sound-guiding structure to achieve wide frequency response not limited by the frequency performance of a single driver.

It is yet another objective of the present invention to provide a loudspeaker system whose structure both supports the drivers mounted within, as well as forming an acoustical horn to direct sound waves uniformly over a wide angle.

It is yet another objective of the present invention to provide high-frequency sound efficiently and uniformly over a wide angle, typically a full hemisphere, while avoiding the presence of undesirable lobes in the sound pattern of the loudspeaker system.

SUMMARY OF THE INVENTION

A hemispherically wide-radiating-angle loudspeaker system includes a low-frequency driver mounted in a spheroidal structure, or enclosure, a high-frequency driver, and a sound-guiding structure located between the high- and low-frequency drivers. The spheroidal structure has an outer surface having an associated first acoustic path length. The low-frequency driver has a first acoustical center, while the high-frequency driver has a different, second acoustical center. The axes of the high- and the low-frequency drivers coincide.

The high-frequency driver also has a forward radiating region, and is mounted facing the low-frequency driver so that its forward radiating region is directed towards the low-frequency driver.

The surface of the sound-guiding structure describes a second associated acoustic path length, and is used both for reflecting and diffracting sound produced by the low-frequency driver and for guiding the sound from the high-frequency driver. The sound-guiding structure is positioned between the low frequency driver and the high-frequency driver. The sound guiding structure is preferably made up of a sound distribution structure and a sound filtering structure. The sound distribution structure is located such that, in combination with the sound-filtering structures and the sphere, it will cause the output of the low-frequency driver to scatter in a hemispherical pattern perpendicular to the surface of the sound-distribution structure, in such a manner that the peaks in the frequency response caused by diffraction around the structure and the sphere, and by cancellation of reflections within the structure, do not align periodically in the frequency domain, that is, that the cepstrum from any angle, but particularly integrated over a 90 degree included angle from the axis perpendicular to the sound-guiding structure, does not contain sharp peaks.

This result is achieved by choosing the acoustic path length along the spherical surface in relation to the acoustic path length along the surface of the sound-guiding structure. Thus, a horn is created that guides the high frequencies uniformly. The horn mouth is defined by the area of a closed surface described by rotating around the structure a tangent to both the sphere and the circumference of the sound-distributing structure. The horn throat is located on the axis of the high-frequency driver's radiating means which may be a diaphragm or a plasma. The horn area develops axially to the high-frequency driver's radiating means until reaching approximately the mid-point between the high- and low-frequency drivers, whereupon it folds to develop radially to the axis of the high-frequency driver s radiating means. The horn length is approximately the locus of the center of the developing area from the throat to the mouth. These parameters may then be used to calculate a horn flare using the well-known Webster horn equation and its expansions by Morse.

The horn functions more uniformly with respect to frequency in conjunction with the reflections from the sound-distributing structure of the low-frequency sound when the acoustical centers of the low-frequency and high-frequency drivers are placed in virtual coincidence. To accomplish this, the horn length is made to compensate for the shorter group delay of the lighter-mass high-frequency driver than that of the heavier low-frequency driver.

More specifically, in the wide-radiating-angle loudspeaker system described above, the sound-guiding structure having sound-filtering structures further comprise means for guiding sound waves from the high-frequency driver. These means are interposed between the high-frequency driver and the low-frequency driver and positioned with respect to the sound-guiding structure and the outer spherical surface so that the outer surface and the sound-distribution structure form an acoustical horn for distribution of the sound from the high-frequency driver.

A further advantage of the invention lies in the mounting of the high-frequency driver on the sound-distribution structure such that the means for guiding sound waves from the high-frequency driver allows virtual spatial coincidence of the acoustical centers of the high- and low-frequency drivers. Because the acoustic centers of the drivers are not substantially separated in space, their outputs do not interfere as a function of wavelength in the frequency range where their outputs overlap, that is, the crossover region. Therefore, the function of the crossover network can be reduced mainly to efficiently and safely distribute the input power to the appropriate driver, thereby simplifying the network, which, in turn, reduces power loss and distortion.

Any type of high-frequency driver can be used in this speaker system including those with dynamic, magnetic, electrostatic, piezoelectric, or magnetostrictive motors attached to a diaphragm either center or edge driven, or to Plasmas, i.e., any high-frequency transducer for airborne sound.

In the event a low-frequency driver is not desired, a wide-directivity high-frequency loudspeaker system using the Present invention can also be configured. Such a system consists of a spheroidal structure, having an outer surface and an associated first acoustic path length; a high-frequency driver; and a sound-guiding structure having a second acoustic Path length. The sound-guiding structure is positioned near the spheroidal structure, between the high-frequency driver and the spheroidal structure. The high-frequency driver is mounted with its forward radiating region towards the spheroidal structure.

As before, the second acoustic path length of the sound-guiding structure in conjunction with the first acoustic path length of the outer surface form a horn with wide-angle high-frequency directivity characteristics.

The high-frequency driver is mounted in an enclosure located within the sound-guiding structure so that the high-frequency driver is facing a means for guiding, or redirecting sound waves from the high-frequency driver. These means are positioned with respect to the sound-guiding structure and the outer surface so that the outer surface and the various parts of the sound-guiding structure form an acoustical horn for distribution of sound from the high-frequency driver. The high-frequency loudspeaker system can contain dynamic, magnetic, electrostatic, piezoelectric, or magnetostrictive motors attached to a diaphragm either center or edge driven, or to plasmas, i.e., any high-frequency transducer for airborne sound.

DESCRIPTION OF THE PREFERRED EMBODIMENT

Figure 1:
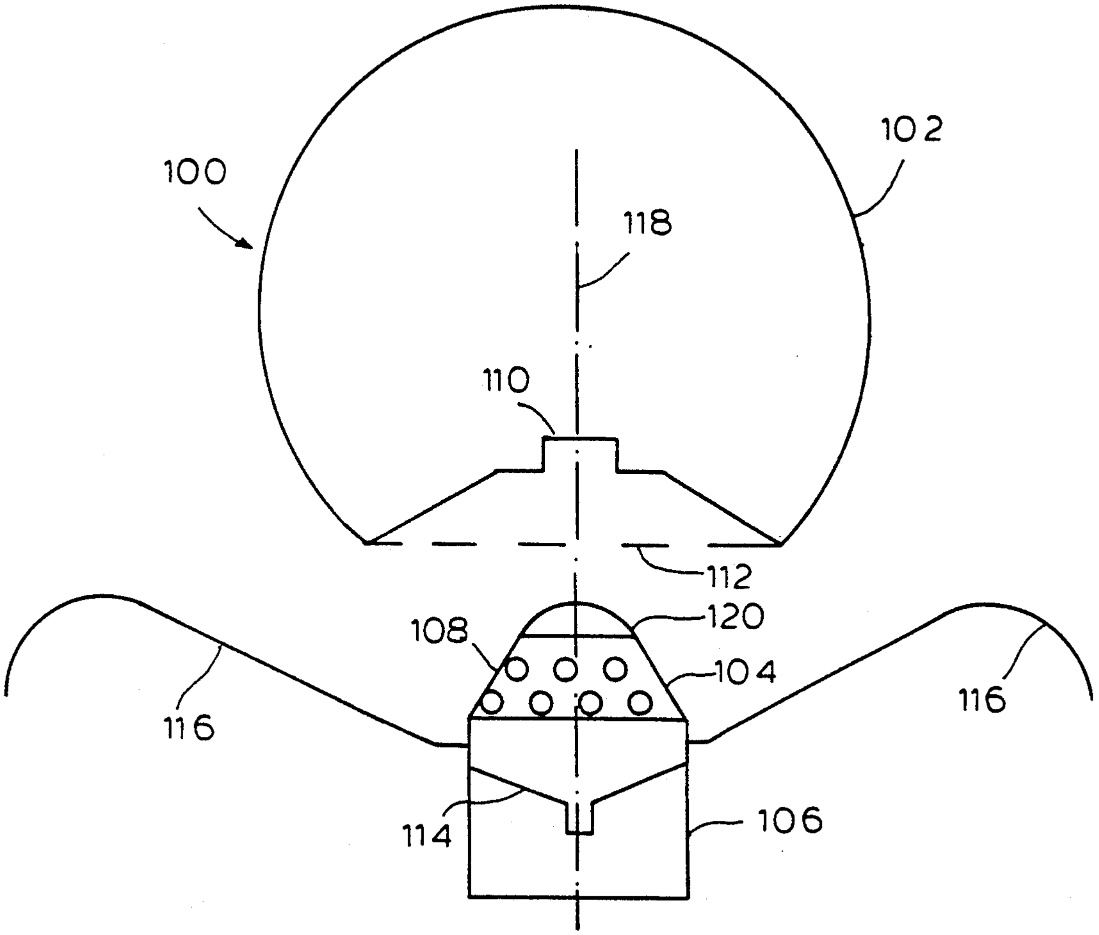
FIG. 1 illustrates the overall structure of, low and high-frequency drivers, sound-filtering and horn components of the present invention.

Referring to FIG. 1, loudspeaker assembly 100 includes a low-frequency driver 110 mounted in a spherical shell 102. The shell is preferably of fiberglass-reinforced polyester, injection-foamed polystyrene or any similar well-damped material. The shell contains within it material to absorb and attenuate internal sound reflections.

Low-frequency driver 110 is covered by grille 112. Grille 112, a sound-filtering structure, is essentially transparent to the low frequencies generated by driver 110, that is, the grille 112 does not offer significant resistance to the sound waves generated by driver 110. However, grille 112 presents sufficient acoustic mass so that it, with the presence of driver 110 behind it, provides an opaque surface for high-frequency sounds, thus providing a boundary for the horn development where horn-boundary void 126, shown on FIG. 3, occurs.

Juxtaposed to the grille 112 of driver 110 is sound-filtering structure 108. Structure 108 has a perforated region 104 and is attached to sound-distribution structure 116 to cover high-frequency driver 114 which, typically, is a dynamic compression driver with an integral short horn. Sound-distribution structure 116, which may be corrugated circularly, extends circularly from the juncture of driver 114 and the lower circumference of structure 108. Sound-filtering structure 108, sphere 102, grille 112, sound-distribution structure 116 and drivers 110 and 114 are aligned along axis 118 to one another. Sound filtering structure 1089 and sound distribution structure 116 constitute an exemplary sound-guiding structure essential to the operation of this system.

Figure 2:
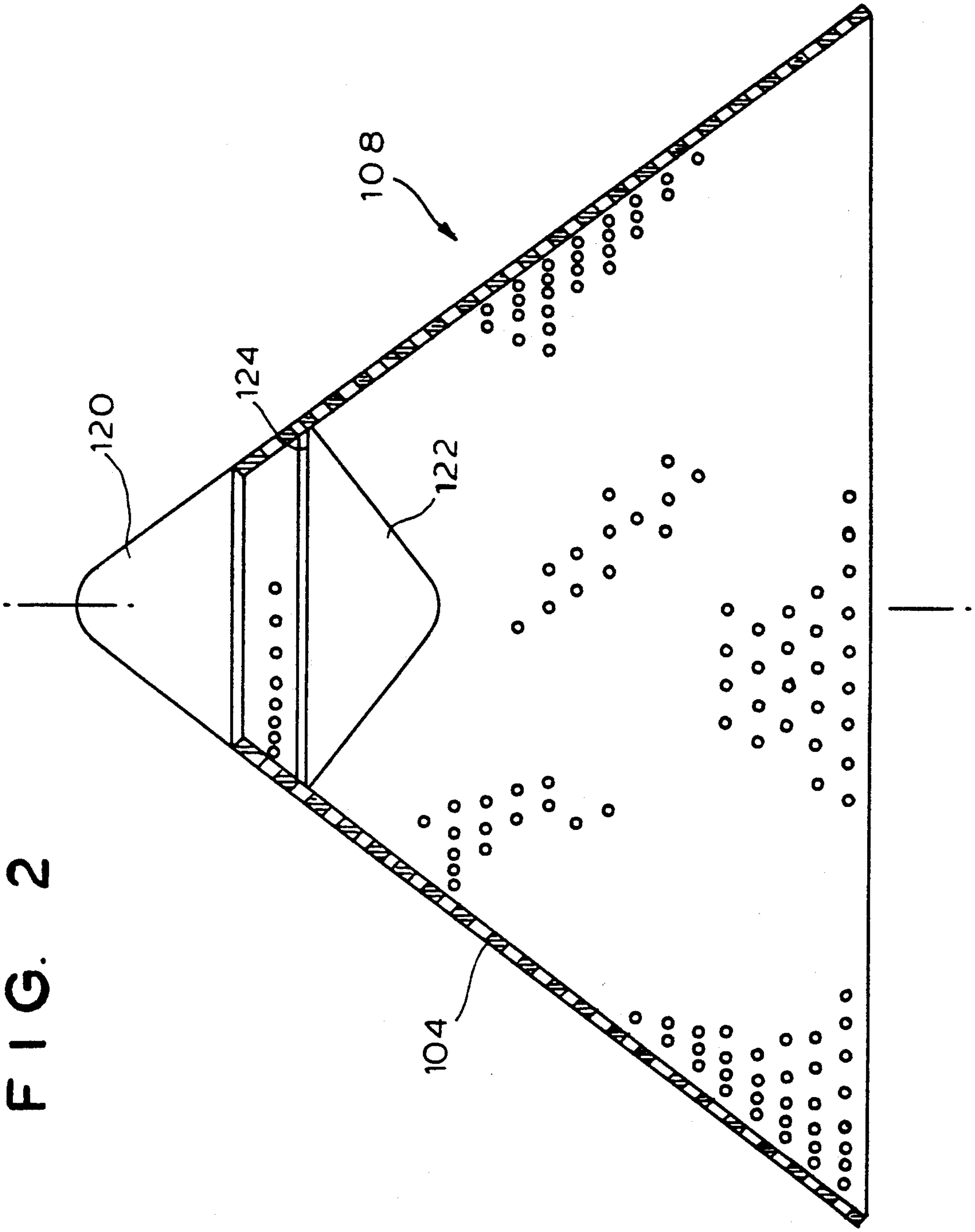
FIG. 2 is a detailed view of the sound-filtering structure which is located at the fold of the horn, which constitute boundaries of the horn.

Sound-filtering structure 108 is shown in greater detail in FIG. 2. Referring to FIG. 2, sound-filtering structure 108 includes perforated region 104, upper conical surface 120 and lower conical surface 122. Lower conical surface 122 is internal to structure 108 as well as to perforated region 104.

Perforated region 104 is typically manufactured from 18 gauge sheet steel (electrozinc plating 0.0008 inches thick), having perforations of 0.062 inches diameter staggered on 0.125 inch centers. These perforations are chosen to allow the high frequency sound from driver 114 to radiate relatively unimpeded. Its perforations in conjunction with the air behind it form a Helmholtz resonator with a cutoff frequency above that of the low-frequency driver. This Helmholtz resonator precludes to a large extent the low-frequency radiation from low-frequency driver 110 from entering the cavity internal to structure 108, thereby, in conjunction with conical surface 120, scattering the sound generated from low frequency driver 110. In other words, the structure of perforated region 104, the air internal to it, and high frequency driver 114 can be viewed as a Helmholtz resonator that will effectively scatter frequencies from low-frequency driver 110. Because of the relatively high cutoff frequency, the Helmholtz resonator also improves the low-end frequency response of high-frequency driver 114.

In an exemplary implementation of this perforated region 104 for use with a typical 12 inch diameter low-frequency driver, the inside diameter at the larger base is 7.78+/−0.020 inches, while the height of the perforated region 104 is 3.850+/−0.030 inches. The smaller, top opening of perforated region 104 has an internal diameter of 1.655 inches. This geometry dictates that the angle between the walls of the perforated region 104 and a plane perpendicular to the longitudinal axis of region 104 be approximately 38 degrees.

Connected to the upper part of perforated region 104 within structure 108 is upper conical surface 120. This upper conical surface 120 is typically fabricated from sheet metal and welded to close the upper, smaller opening of perforated region 104. In contrast to perforated region 104, upper conical surface 120 does not have perforations. The apex of upper conical surface 120 is typically rounded to a section of a sphere having a 0.350 inch radius.

Figure 3:
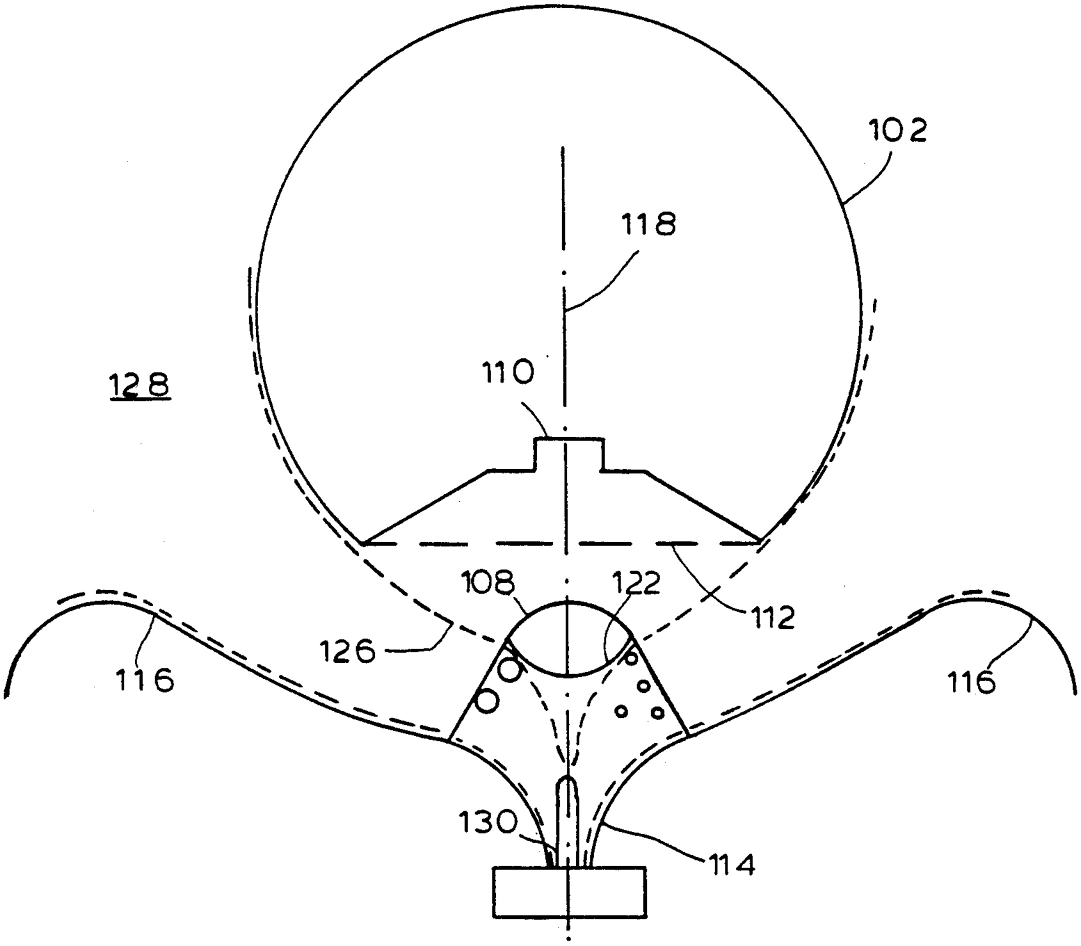
FIG. 3 shows the ideal mechanical boundaries of the horn superimposed on the cross-section of the actual structure.

Internal to perforated region 104 is mounted inverted conical surface 122. Conical surface 122 is fabricated from sheet metal and has no perforations. The walls of inverted conical surface 122 are at an angle with the walls of perforated section 104 such as to act, as shown in FIG. 3, as a portion of the horn wall that guides sound generated from high frequency driver 114 and, typically, to act as a continuation of the horn integral with the typical driver 114. The apex of conical surface 122 is typically rounded to a section of a sphere having a 0.250 inch radius. The outer circumference of inverted conical surface 122, shown at 124, is welded with a spacing of 0.780 inches below the base of upper conical surface 120. This spacing between upper conical surface 120 and lower conical surface 122 allows placement in space of the region where the horn for high-frequency driver 114 begins to fold from axial to radial to the driver. Guiding the high frequencies from driver 114 will also move the acoustical center of the high-frequency driver 114 into a desired position relative to that of the low-frequency driver 110 so as to allow minimal interference of the low-frequency sound from low-frequency driver 110 with the high frequency sounds from high-frequency driver 114 at the crossover frequency. The result of guiding the audio output from the high-frequency driver is to essentially place the acoustical centers of both the high frequency and low-frequency drivers in as close to virtual coincidence as desired.

Returning to FIG. 1, structure 108 described in FIG. 2 is attached to sound-distribution structure 116. Sound-distribution structure 116 in conjunction with the surface of the sphere 102 and grille 112 form a horn for the high-frequency driver 114. Beyond driver 114 and structure 108, which forms the driver and throat of the horn, the shape of the surface areas making up the structure of the loudspeaker system fold to the configuration of an acoustical "radial" horn; that is, a full circle radiator having two sides, a top (sphere 102) and a bottom, (sound-distribution structure 116). Since the entire sphere 102 continues its side of the horn beyond the mouth, the loading presented to the high-frequency driver is asymmetrical, i.e., the acoustic length of the sphere 102 side is longer than the acoustic length of the sound-distribution structure 116 in conjunction with assembly 108. As a result, the high-frequency sound waves encounter a discontinuity at the end of the "shorter" side of the horn mouth, the outer edge of sound-distribution structure 116. This discontinuity further causes sound to be diffracted over the sphere, thereby improving the hemispherical nature of the sound emanating from the assembly. The radial horn also has the function of improving the impedance match of the high-frequency driver to the air in the room.

FIG. 1 shows high frequency driver 114 housed in housing 106. Housing 106 prevents high frequency radiation from escaping from the driver 114. Conversely, in FIG. 3, high frequency driver 114 is of the type where the housing is an integral part of the assembly of driver 114, and is therefore not shown separately.

FIG. 3 shows the cross-section of a typical implementation of the developed radial horn superimposed on the structures of the hemispherically wide-radiating-angle loudspeaker system. The structures are arranged to provide as much of the surface of the horn walls as possible with minimal voids. Where mechanical voids do occur, they are filled by high-impedance acoustical boundaries. Throat area 130 is in close proximity to the diaphragm of high frequency driver 114. Area 126 develops the folded horn further by the presence of inverted cone 122. The mouth of the horn 128 is created by the unequal acoustic lengths of the length along sphere 102 and structure 116.

In the preferred embodiment, the crossover network which directs low-frequency electrical input to the low-frequency driver and high-frequency electrical input to the high-frequency driver takes advantage of the virtual coincidence of the acoustical centers of the drivers in space. The network consists only of a two or four pole high-pass electrical filter for the high-frequency driver. In the preferred embodiment, high-frequency electrical input is kept from the low-frequency driver by means of a sharply-rising high-frequency voice-coil impedance.

In the alternative, if a low frequency driver is not desired in the system, only a high frequency driver may be used without a low frequency driver being present. In effect, the structure shown in FIG. 1 and FIG. 3 would be used, without having low frequency driver 110 present. Now, grille 112 can be replaced by a solid cover having opaque sound characteristics, such as sheet steel.

Although the present invention has been shown and described with respect to preferred embodiments, various changes and modifications which are obvious to persons skilled in the art of which the invention pertains are deemed to lie within the spirit and scope of the invention. Thus, numerous changes and modifications can be made while staying within the scope of the invention which is set forth in the appended claims.

I claim:

1. A wide-angle-directivity loudspeaker system comprising:

a low-frequency driver having a first acoustical center, said low-frequency driver mounted in a spheroidal structure, including an outer surface having a first acoustic path length;

a high-frequency driver having a second acoustical center and a forward radiating region, said high-frequency driver mounted facing said low-frequency driver so that said forward radiating region of said high-frequency driver is directed towards said low-frequency driver; and a sound-guiding structure having a second acoustic path length different from said first acoustic path length, for reflecting and diffracting sound produced by said low-frequency driver and said high-frequency driver, said sound-guiding structure comprising a sound-distribution structure and a means for guiding sound waves from said high-frequency driver, and being interposed between said high-frequency driver and said low-frequency driver and positioned with respect to said outer surface so that said outer surface and said sound-guiding structure form an acoustical horn for guiding the sound from said high-frequency driver.

2. A wide-angle-directivity loudspeaker system as described in claim 1 wherein said low frequency driver is covered by a grille, said grille forming a sound-filtering structure which presents sufficient acoustic mass so that it provides an opaque surface for sounds from said high-frequency driver.

3. A wide-angle-directivity loudspeaker system as described in claim 1 wherein the position of said means for guiding sound waves from said high-frequency driver allows virtual spatial coincidence of said second acoustical center with said first acoustic center while at the same time reflecting and diffracting the output of the low-frequency driver.

4. A wide-directivity loudspeaker as in claim 3 wherein said high-frequency driver is a dynamic tweeter comprising an integral driver and short horn.

5. A wide-directivity loudspeaker as in claim 3 wherein said high-frequency driver is a magnetic tweeter comprising an integral driver and short horn.

6. A wide-directivity loudspeaker as in claim 3 wherein said high-frequency driver is a electrostatic tweeter comprising an integral driver and short horn.

7. A wide-directivity loudspeaker as in claim 3 wherein said high-frequency driver is a piezoelectric tweeter comprising an integral driver and short horn.

8. A wide-directivity loudspeaker as in claim 3 wherein said high-frequency driver is a magnetostrictive tweeter comprising an integral driver and short horn.

9. A wide-directivity loudspeaker as in claim 3 wherein said high frequency driver is a plasma tweeter comprising an integral driver and short horn.

10. A wide-directivity high-frequency loudspeaker system comprising:

a spheroidal structure, including an outer surface having a first acoustic path length;

a high frequency driver having a forward radiating region and a rearward radiating region;

a sound-guiding structure having a second acoustic path length, said sound-guiding structure comprising a sound-distribution structure and a means for guiding sound from said high-frequency driver and being positioned near said spherical structure between said high-frequency driver and said spheroidal structure so that said outer surface and said sound-guiding structure form an acoustical horn for guiding the sound from said high-frequency driver; and wherein said high-frequency driver is mounted so that said forward radiating region is facing the means for guiding sound from said high-frequency driver.

11. A wide-directivity loudspeaker as in claim 10 wherein said high-frequency driver is a dynamic tweeter comprising an integral driver and short horn.

12. A wide-directivity loudspeaker as in claim 10 wherein said high-frequency driver is a magnetic tweeter comprising an integral driver and short horn.

13. A wide-directivity loudspeaker as in claim 10 wherein said high-frequency driver is a electrostatic tweeter comprising an integral driver and short horn.

14. A wide-directivity loudspeaker as in claim 10 wherein said high-frequency driver is a piezoelectric tweeter comprising an integral driver and short horn.

15. A wide-directivity loudspeaker as in claim 10 wherein said high-frequency driver is a magnetostrictive tweeter comprising an integral driver and short horn.

16. A wide-directivity loudspeaker as in claim 11 wherein said high frequency driver is a plasma tweeter comprising an integral driver and short horn.

* * * * *